United States Patent
Nguyen

[19]

[11] Patent Number: 6,014,042
[45] Date of Patent: Jan. 11, 2000

[54] PHASE DETECTOR USING SWITCHED CAPACITORS

[75] Inventor: Nhat M. Nguyen, San Jose, Calif.

[73] Assignee: Rambus Incorporated, Mountain View, Calif.

[21] Appl. No.: 09/025,983

[22] Filed: Feb. 19, 1998

[51] Int. Cl.[7] .................................................. H03K 5/26
[52] U.S. Cl. .............................. 327/3; 327/541; 327/543; 323/315
[58] Field of Search ................................... 327/2, 3, 7, 9, 327/10, 12, 538–541, 543; 323/312, 315

[56] References Cited

U.S. PATENT DOCUMENTS

| | | | |
|---|---|---|---|
| 5,204,612 | 4/1993 | Lingstaedt | 323/317 |
| 5,408,174 | 4/1995 | Leonowich | 323/315 |
| 5,614,855 | 3/1997 | Lee et al. | 327/158 |
| 5,825,209 | 10/1998 | Stark et al. | 327/3 |
| 5,838,191 | 11/1998 | Opris et al. | 327/539 |

*Primary Examiner*—Tuan T Lam
*Attorney, Agent, or Firm*—Pennie & Edmonds LLP

[57] ABSTRACT

A phase detector operating in a low voltage environment and providing a substantially constant integral voltage over variations in temperature, supply voltage and process parameters. The quadrature phase detector includes an equalizer, a switching unit, a sampler and comparator unit and a bias generator. The bias generator includes a switched capacitor structure which produces a bias current which tracks fluctuations in capacitance values due to temperature, supply voltage and process variations. The errors introduced due to fluctuations in bias current and capacitance are thus minimized.

8 Claims, 7 Drawing Sheets

PHASE DETECTOR USING SWITCHED CAPACITORS

FIELD OF THE INVENTION

The present invention relates in general to integrated circuits and in particular to improved method and circuitry for implementing phase detectors with a bias current source that is insensitive to power supply, temperature and process variations.

BACKGROUND OF THE INVENTION

Figure 1:
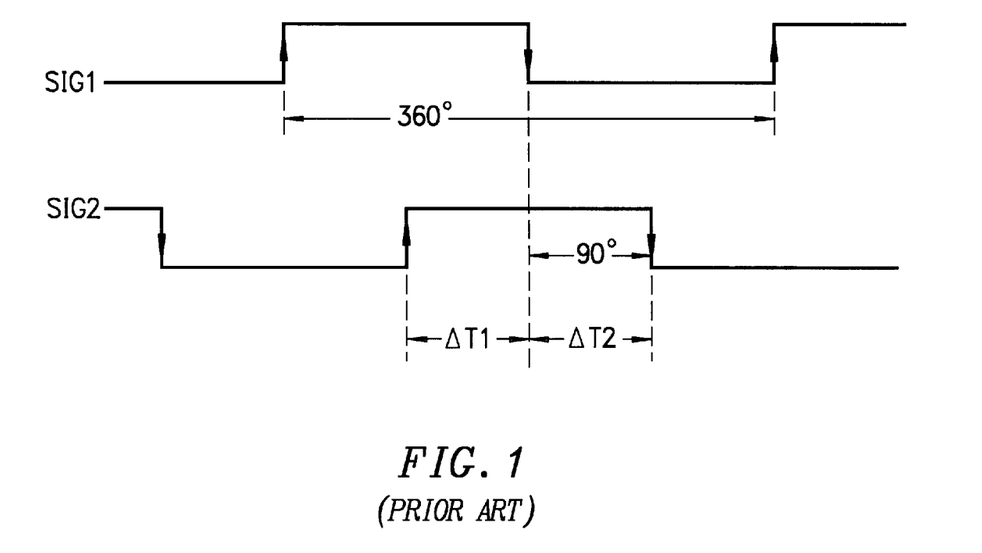
FIG. 1 depicts two input signals in a quadrature condition.

Phase detectors can be found in various electronic circuits and systems including telecommunication and computer systems as well as semiconductor memories. A common application for phase detectors is in signal sampling to facilitate synchronous interface between circuits. For optimum sampling of an input data, it is desirable to have the sampling clock in quadrature phase with respect to the input data. Two signals are said to be in quadrature if they are 90 degrees out of phase. As shown in FIG. 1, signals SIG1 and SIG2 operate at the same frequency and each has a duty cycle of 50% and are in quadrature. The rising edge of signal SIG2 thus occurs at exactly the mid point of the signal SIG1 pulse.

Figure 2:
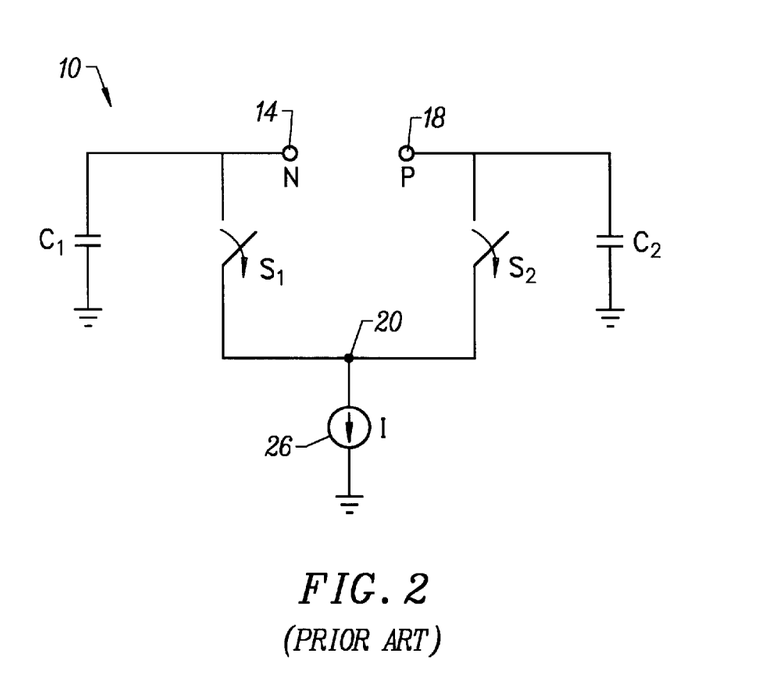
FIG. 2 depicts a simplified quadrature phase detector circuit.

A simplified example of a quadrature phase detector circuit is shown in FIG. 2. As depicted in FIG. 2, circuit 10 includes a first capacitive element C1 coupled between ground and node N and a second capacitive element C2 coupled between ground and node P. A switch S1 is coupled between node N and node 20 and a switch S2 is coupled between node P and node 20. A current source 26 coupled between node 20 and ground provides a bias current I for the circuit.

Figure 3A:
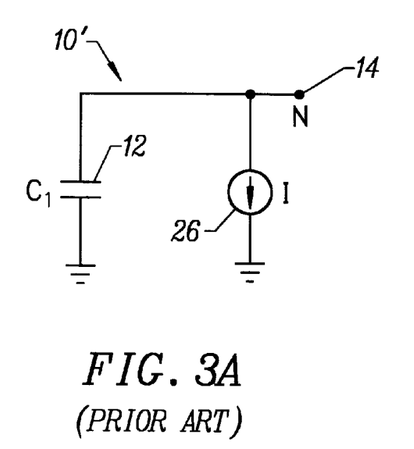
FIG. 3a depicts the circuit shown in FIG. 2 when switch S1 is closed and switch S2 is open.

The two input signals SIG1 and SIG2 as shown in FIG. 1 are applied to and control the opening and closing of switches S1 and S2, respectively. The switches are controlled such that switch S1 is closed and switch S2 is open during time interval $\Delta T_1$, and switch S1 is open and switch S2 is closed during time interval $\Delta T_2$. During time interval $\Delta T_1$, when switch S1 is closed and switch S2 is open, circuit 10 of FIG. 1 reduces to circuit 10' depicted in FIG. 3a. Circuit 10' is essentially an integrator circuit, and assuming a linear operation, the voltage at node N ($V_N$) is given by:

$$\Delta V_N = -(I/C1)\Delta T_1 \qquad \text{Equation 1}$$

Figure 3B:
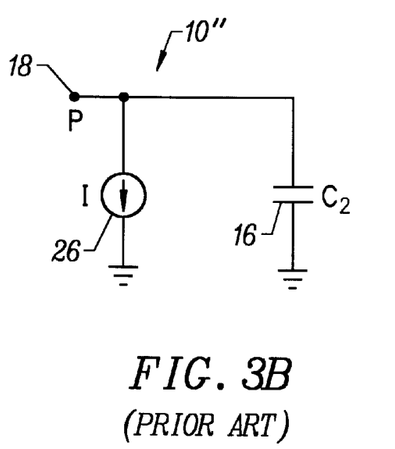
FIG. 3b depicts the circuit shown in FIG. 2 when switch S1 is open and switch S2 is closed.

During time interval $\Delta T_2$, when switch S1 is open and switch S2 is closed, circuit 10 of FIG. 2 reduces to circuit 10" depicted in FIG. 3b. Circuit 10" also forms an integrator with the voltage at node P ($V_P$) determined by:

$$\Delta V_P = -(I/C2)\Delta T_2 \qquad \text{Equation 2}$$

If the capacitors C1 and C2 are equal in value (i.e. C1=C2=C), then equations 1 and 2 reduce to:

$$\Delta V_N = -(I/C)\Delta T_1 \qquad \text{Equation 1a}$$

$$\Delta V_P = -(I/C)\Delta T_2 \qquad \text{Equation 2a}$$

Accordingly, signals SIG1 and SIG2 would be in quadrature if $\Delta T_1$ is equal to $\Delta T_2$. From equations 1a and 2a, $\Delta T_1$ is equal to $\Delta T_2$ if voltage $V_N$ is equal to $V_P$, or ($V_N - V_P$) is equal to zero. Thus, the quadrature condition is detected by sampling the differential voltage at node N and node P and comparing the sampled voltage ($V_P - V_N$) value to zero. That is, input signals SIG1 and SIG2 are in quadrature if the difference between the sampled voltages is zero.

The above described technique for detecting quadrature condition can be effectively used only if integrated voltages $\Delta V_N$ and $\Delta V_P$ remain well-defined and preferably constant over time periods $\Delta T_1$ and $\Delta T_2$. The integrated voltage is described by the following generalized equation:

$$\Delta V = (I/C) * \Delta T \qquad \text{Equation 3}$$

where "$\Delta V$" refers to the integrated voltage, "I" refers to the bias current provided by the bias current source, "C" refers to the capacitance value, and "$\Delta T$" refers to a given time interval when one switch is closed and the other switch is open. From the above equation, in order to maintain a constant integrated voltage, the ratio of the bias current to the capacitance (i.e., I/C) must remain constant over time intervals $\Delta T1$ and $\Delta T2$. In order to maintain a constant bias current to capacitance (i.e., I/C) ratio, either the bias current I and the capacitance value C must remain constant over time period $\Delta T$, or variations in the value of the bias current I and capacitance C must track and therefore cancel each other.

It is, however, difficult in integrated circuit implementations of quadrature phase detectors to achieve a constant bias current due to variations in temperature, supply voltage and process parameters. Prior art implementations have shown that a bias current can vary up to 100% from its nominal value due to effects of variations in temperature, voltage and processing techniques. Such variations are not acceptable for constructing accurate quadrature phase detectors.

Figure 4:
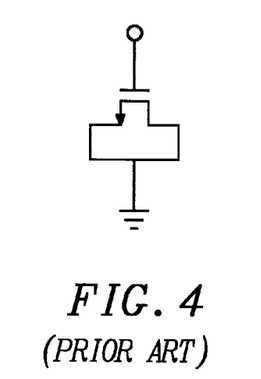
FIG. 4 depicts a MOS capacitive element structure.

In addition to variations in bias current, the capacitance value of the capacitive elements may also fluctuate in response to changes in temperature, voltage and process parameters. In integrated circuits using CMOS technology, capacitors are typically made of a MOS structure as shown in FIG. 4. The effective capacitance for the MOS capacitive element depicted in FIG.4 is given by:

$$C = C_{ox} * (W*L) \qquad \text{Equation 4}$$

where, "C" is the capacitance value of the MOS structure, "$C_{ox}$" is the oxide capacitance per unit area of the transistor channel region, and "(W*L)" is the area of the MOS device. The oxide capacitance "$C_{ox}$" varies with variations in process and thus the effective capacitance of the MOS device varies. As a result of variations in the capacitance value, a constant integrated voltage cannot be maintained during time intervals $\Delta T_1$ and $\Delta T_2$, resulting in inaccurate determination of quadrature conditions.

In an effort to provide a constant and stable bias current, prior art techniques have used band-gap bias current generators. However, band-gap based bias current generators require resistor elements and bipolar junction transistors (BJTs) which are not optimally available in a CMOS process. Further, even though band-gap current generators provide a stable bias current, the problems associated with variations in capacitance values still persist.

Thus, it is desirable to provide a phase detector which minimizes inaccuracies caused by variations in power supply voltage, temperature and/or process parameters.

SUMMARY OF THE INVENTION

By virtue of the present invention, a phase detector is provided which maintains a constant integrated voltage under variations in temperature, supply voltage and process parameters. Broadly, the present invention utilizes switched capacitor circuit techniques to implement a novel bias current generator which substantially reduces the effects of variations in temperature, supply voltage and process parameters on the operation of the overall circuit. The capacitor used in the switched capacitor bias current generator has the same structure as the capacitors used in the phase detector circuit such that the ratio of bias current to capacitor value remains substantially constant with variations in temperature and process parameters.

Accordingly, in one embodiment, the present invention provides a phase detector circuit including first and second capacitive elements coupled to first and second nodes, respectively, a current source, first and second switching elements coupling the current source to the first and second capacitive elements in response to the first and second signals, and a compare circuit coupled to the first and second nodes for comparing integrated values of the first and second signals at the first and second nodes, wherein, a magnitude of current for the current source is set by switching a third capacitive element between first and second reference signals.

In another embodiment, the present invention provides a method for detecting a phase relationship between a first signal and a second signal, including the steps of: (A) generating a bias current by switching a capacitive element between a power supply voltage and a reference signal; (B) integrating the bias current over a first capacitor made of a structure substantially similar to that of the capacitive element, to generate a first integrated signal; (C) integrating the bias current over a second capacitor made of a structure substantially similar to that of the capacitive element, to generate a second integrated signal; and (D) measuring a difference between the first integrated signal and the second integrated signal.

A further understanding of the nature and advantages of the inventions may be realized by reference to the remaining portions of the specification and the attached drawings.

DESCRIPTION OF SPECIFIC EMBODIMENTS

Figure 5:
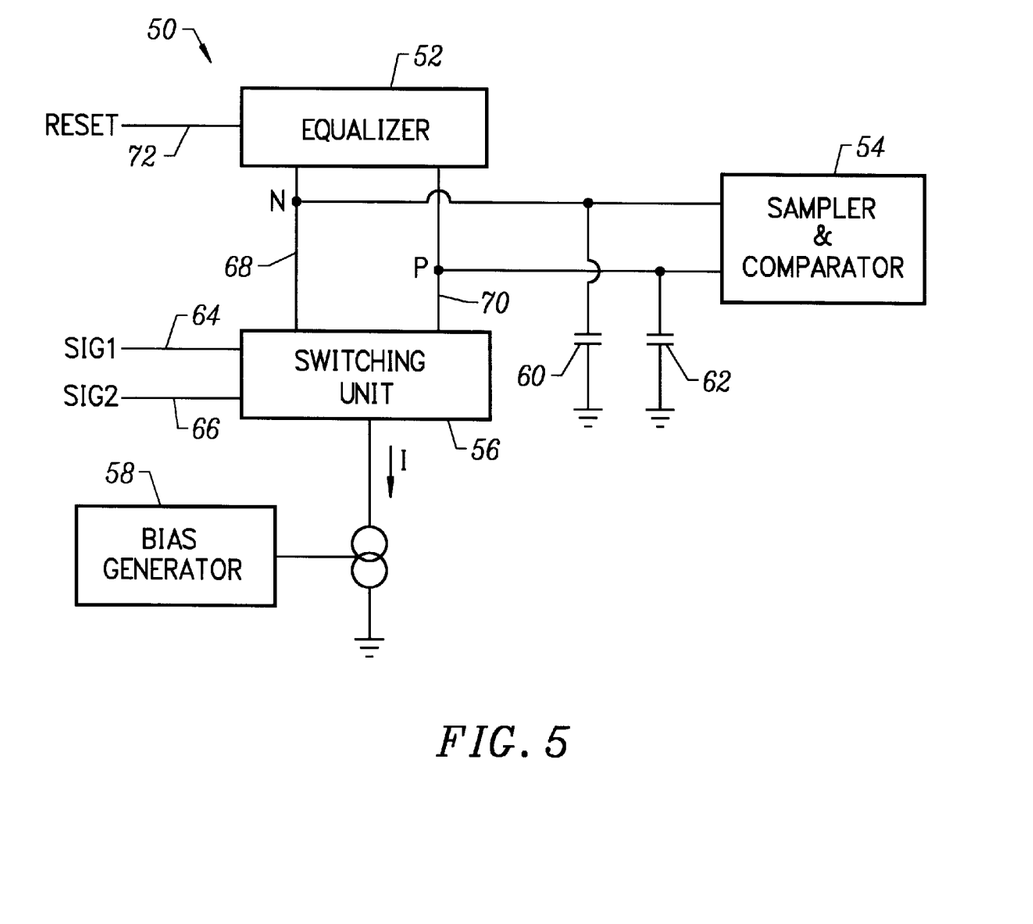
FIG. 5 depicts an embodiment of a quadrature phase detector according to the present invention.

In accordance with the teachings of the present invention a low voltage phase detector is provided which utilizes a switched capacitor structure to provide a constant voltage that is substantially insensitive to variations in supply voltage, temperature and manufacturing process. FIG. 5 depicts a block diagram of quadrature phase detector 50 incorporating an embodiment of the present invention. In the embodiment shown in FIG. 5, quadrature phase detector 50 includes equalizer 52, switching unit 56 having two differential input signals SIG1 on line 64 and SIG2 on line 66, sampler and comparator unit 54, bias generator 58, and capacitive elements 60 and 62. Equalizer 52 receives input reset signal 72 which enables equalizer 52 to initialize quadrature phase detector 50. Equalizer 52 is coupled to switching unit 56 via connectors 68 and 70. Sampler and comparator 54 is coupled to connector 68 at node N and to connector 70 at node P. Capacitive element 60 is coupled between node N and ground. Capacitive element 62 is coupled between node P and ground. Bias generator 58 is coupled to switching unit 56.

In general terms, the block diagram of FIG. 5 provides an improved and novel implementation for the quadrature phase detector of FIG. 2. Capacitive elements 60 and 62 correspond to the two capacitors C1 and C2 of FIG. 2, bias generator 58 generates the bias current I (in FIG. 2), and the remaining circuit blocks perform the switching and other functions of the quadrature phase detector which will be described in greater detail below.

Figure 6:
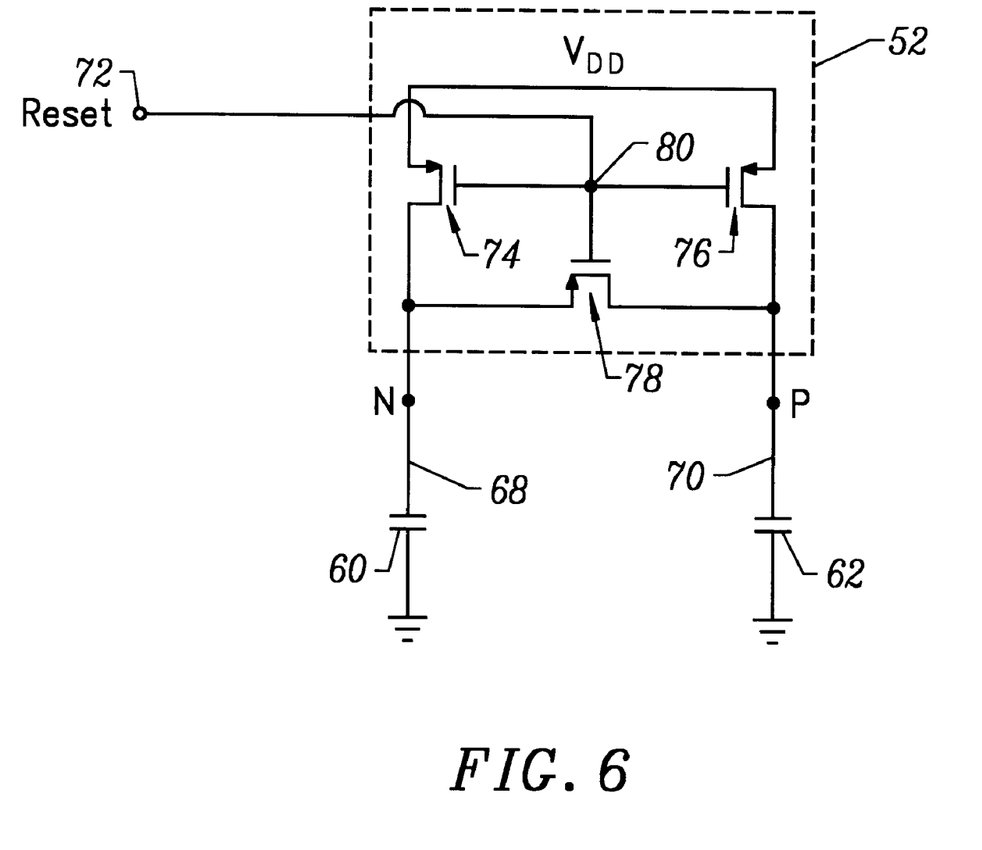
FIG. 6 depicts a circuit diagram for the equalizer shown in FIG. 5.

Equalizer 52 initializes quadrature phase detector 50 before the quadrature phase detection cycle begins. FIG. 6 depicts an implementation of equalizer 52. As depicted in FIG. 6, equalizer 52 includes three MOS transistors 74, 76 and 78. The gates of PMOS transistors 74, 76 and 78 are coupled to form node 80. Reset signal 72 is also connected to node 80. The sources of transistors 74 and 76 are coupled to each other. The drain of transistor 74 is coupled to one source/drain terminal of transistor 78 and the drain of transistor 76 is coupled to the other source/drain terminal of transistor 78. Capacitive element 60 is coupled to equalizer 52 by connector 68 via node N. Capacitive element 62 is coupled to equalizer 52 by connector 70 via node P.

When reset signal 72 is at ground, transistors 74, 76 and 78 are turned on and voltages at nodes N and P are pulled up to circuit power supply voltage ($V_{DD}$). Transistor 78 further facilitates equalization of the two nodes N and P by shorting the two together. When reset signal 72 is pulled up to $V_{DD}$, MOS transistors 74, 76 and 78 are turned off and nodes N and P are released from the precharge condition, allowing phase detector 50 to start integration. Since nodes N and P are pulled up to the supply voltage level $V_{DD}$, equalizer 52 depicted in FIG. 6 is well suited for operating in low voltage applications. This equalizer circuit precharges nodes N and P all the way up to $V_{DD}$ without the use of resistive loads that would otherwise limit the dynamic range of the phase detector. This circuit is therefore capable of operating at lower supply voltages.

Figure 7:
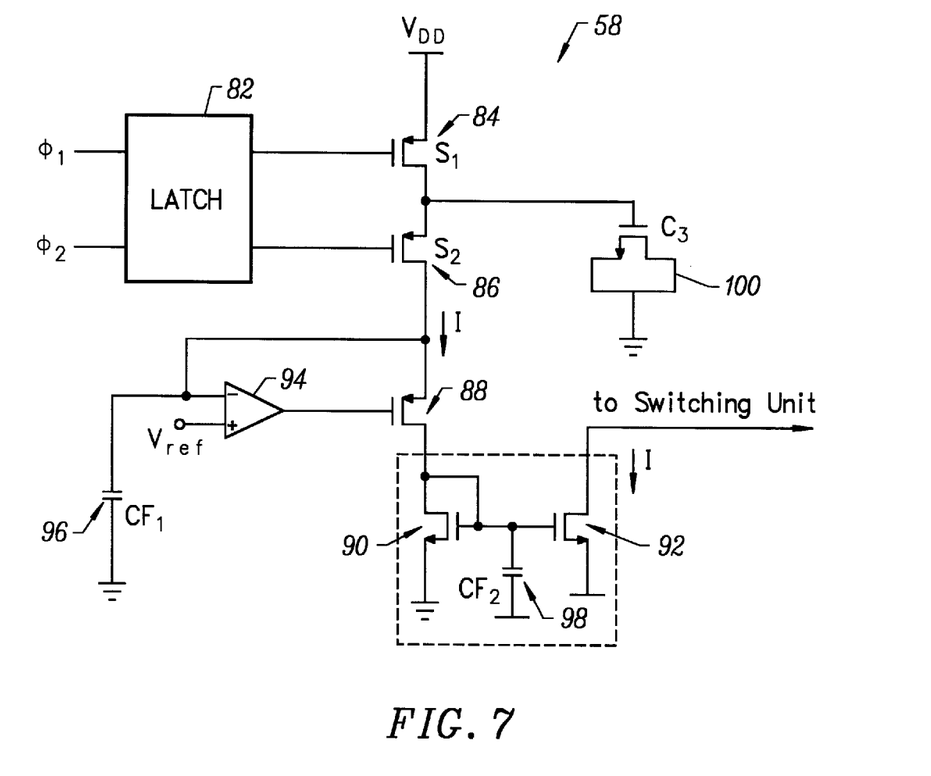
FIG. 7 depicts a circuit diagram for the bias generator incorporating a switched-capacitor structure in accordance with the teachings of the present invention.

Referring to FIG. 7, there is shown an embodiment of bias generator 58 incorporating the present invention. As depicted in FIG. 7, MOS transistors 84, 86 and capacitive element C3 are coupled to each other to form a switched-capacitor resistive element. The source of transistor 84 is connected to power supply voltage $V_{DD}$ and the drain of transistor 84 is coupled to the source of transistor 86. The drain of transistor 86 is coupled to the source of transistor 88. Capacitive element C3 is coupled between the drain of transistor 84 and a ground potential. The drain of transistor 88 is connected to a terminal of current-mirror circuitry 102. An operational amplifier 94 is connected in a unity gain configuration between the source and gate terminals of transistor 88. A capacitive element 96 couples the negative input of operational amplifier 94 to ground, while its positive input connects to a reference voltage $V_{REF}$.

Figure 8A:
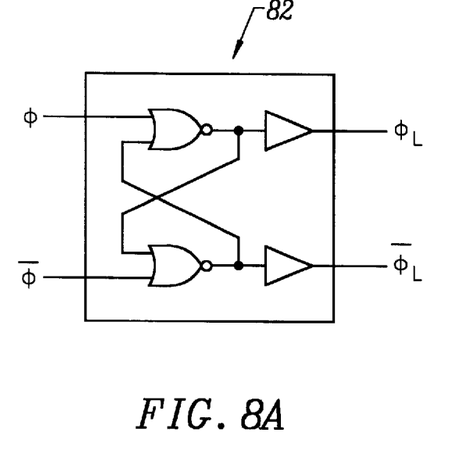
FIGS. 8a and 8b depict two exemplary implementations of non-overlapping clock drivers.
Figure 8B:
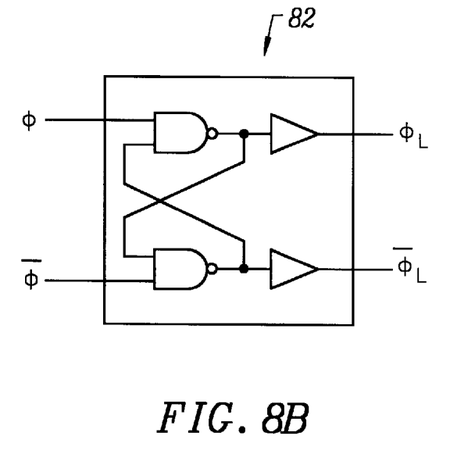

Non-overlapping clock signals are required for the proper operation of a switched-capacitor structure. The gate terminals of transistors 84 and 86 are thus controlled by a non-overlapping clock circuit 82 which receives two clock signals Φ1 and Φ2, where Φ2 is the complement of Φ1. Non-overlapping clock circuit 82 may be implemented by bistable latch circuitry that generates non-overlapping clock signals to drive the gates of MOS transistors 84 and 86. FIGS. 8a and 8b depict two possible implementations of circuit 82 using NOR and NAND gate based latch circuits, respectively.

Capacitive element 96 filters out high frequency signals, due to clock feed-through at the source of MOS transistor 88 and helps maintain the voltage level at this node as close to $V_{REF}$ as possible. An additional capacitive element 98 is part of current mirror circuitry 102 to filter out high-frequency signals at the gates of MOS transistors 90 and 92.

Unlike prior art static bias generators, the switched-capacitor based bias generator 58 of the present invention operates with a clock signal and may be viewed as a dynamic circuit. This circuit requires at least one clock period for the output current I to reach its steady-state value. The steady-state output current for the switched-capacitor structure in bias generator 58 is given by:

$$I = (V_{DD} - V_{REF}) * F * C3 \qquad \text{Equation 5}$$

where F is the frequency of the clock signals at the outputs of circuit 82.

It is evident from equation 5, that the value of the current I is proportional to the capacitance C3. This current I is mirrored by current mirror circuit 102 and applied to switching unit 56 of phase detector 50 in FIG. 5. In the context of the phase detector described above, substituting the value of I given in equation 5 for I in equation 3, the integrated voltage is equal to:

$$\Delta V = \frac{((V_{DD} - V_{REF}) * F * C_3)}{C_{PD}} * \Delta T \qquad \text{Equation 6}$$

The above equation illustrates that if C3 and $C_{PD}$ are made of the same capacitor structure that undergoes the same process variations, such variations are canceled out and have no effect on ΔV. One method of implementing a capacitor in a CMOS process is by connecting the source and drain terminals of a MOS transistors together to form one plate, and using the gate terminal as the other plate, as shown by the symbol for capacitor C3 in FIG. 7. Capacitive elements 60 and 62 in phase detector circuit of FIG. 5 would also be made of MOS transistors to match the structure of bias current generator capacitor C3. Other implementations of a capacitor are known to those skilled in this art.

By thus making the magnitude of the bias current I directly proportional to capacitance C, the circuit of the present invention maintains a constant I/C ratio. Given the term ($V_{DD}-V_{REF}$), the effects of power supply variations can also be reduced by making $V_{REF}$ dependent on $V_{DD}$. This can be achieved by generating $V_{REF}$ using a resistive voltage divider that connects between the power supply and ground. MOS transistors can be used in diode-connected structure to implement the resistive elements in the divider. As a result variations in the bias current for phase detector 50 due to variations in temperature, supply voltage and process parameters are minimized by the dynamic bias generator circuit of the present invention. The variation may be reduced to less than 10% over supply voltage, temperature and process variations using the technique of the present invention. By thus minimizing the effects of bias current and capacitance variations, a constant integrated voltage is maintained over time intervals ΔT1 and ΔT2, resulting in appreciable improvement in accuracy in detecting quadrature conditions.

Figure 9:
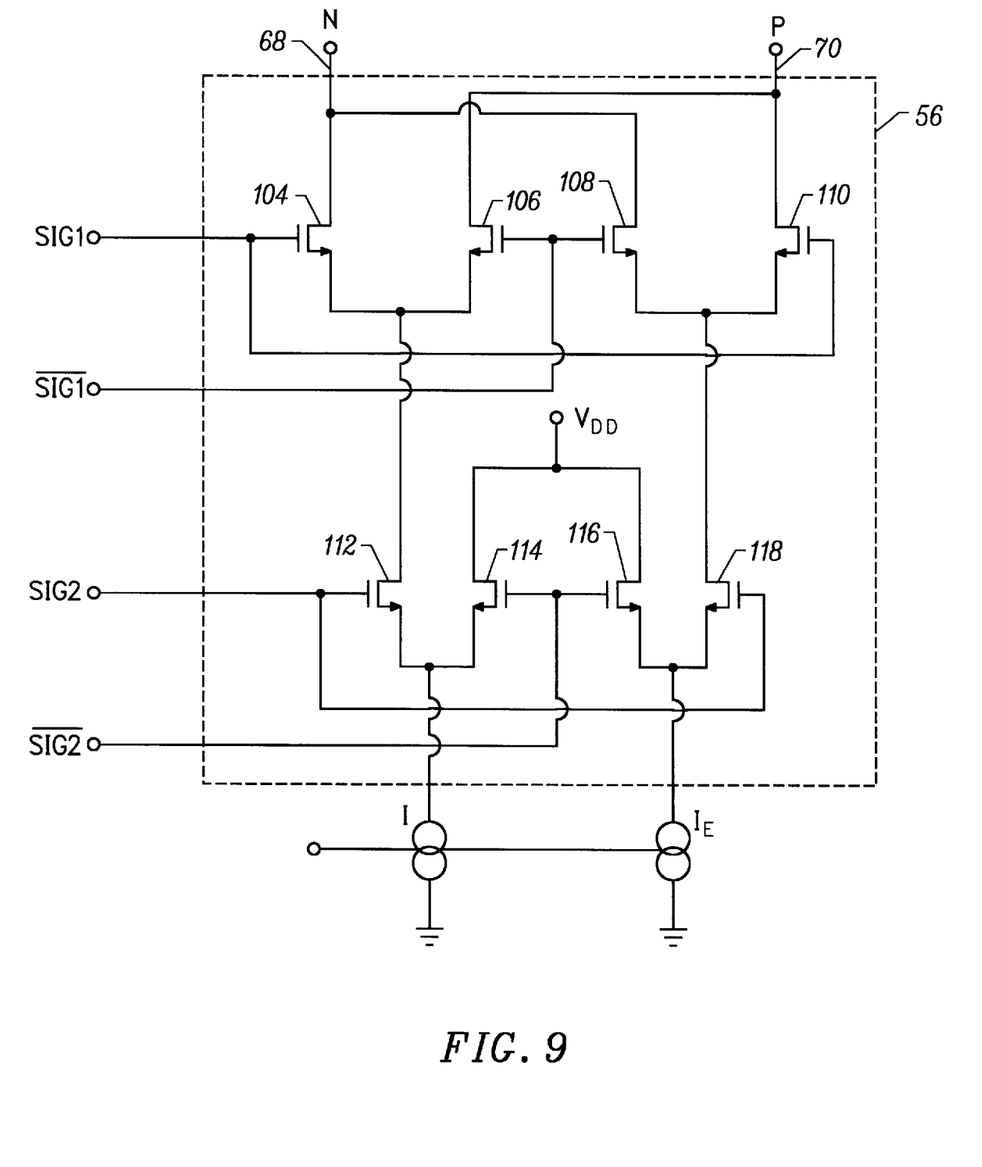
FIG. 9 depicts a circuit diagram for an embodiment of the switching unit shown in FIG. 5.

FIG. 9 depicts switching unit 56 which receives two differential input signals, SIG1 and SIG2. During time interval $\Delta T_1$ when both SIG1 and SIG2 are high, a current path from node N to ground in created by transistors 104 and 112, discharging the capacitor 60 coupled to node N (68 in FIG. 5). During time interval $\Delta T_2$ when SIG1 is low and SIG2 is high, a direct current path is created from node P to ground by transistors 106 and 112, discharging the capacitor 62 coupled to node P (70 in FIG. 5). Due to parasitic capacitances of MOS transistors 104 and 106, charge feed-through can occur at nodes N and P which may cause integration error. MOS transistors 108 and 110 operating at a current level $I_E$, which is some fraction of main bias current I, are used to cancel out the charge feed-through effect.

Sampler and comparator circuit 54 samples the voltages at node N and node P. As described above, signals SIG1 and SIG2 are in quadrature if the differential voltage ($V_P-V_N$) is equal to zero. Thus, sampler and comparator circuit 54 compares the differential voltage ($V_P-V_N$) to zero to determine whether signals SIG1 and SIG2 are in quadrature. Since a substantially constant bias current to capacitance ratio (I/C) is provided in accordance with the teachings of the present invention over variations in temperature, supply voltage and process parameters, the quadrature phase detection is accomplished with negligible error.

Figure 10:
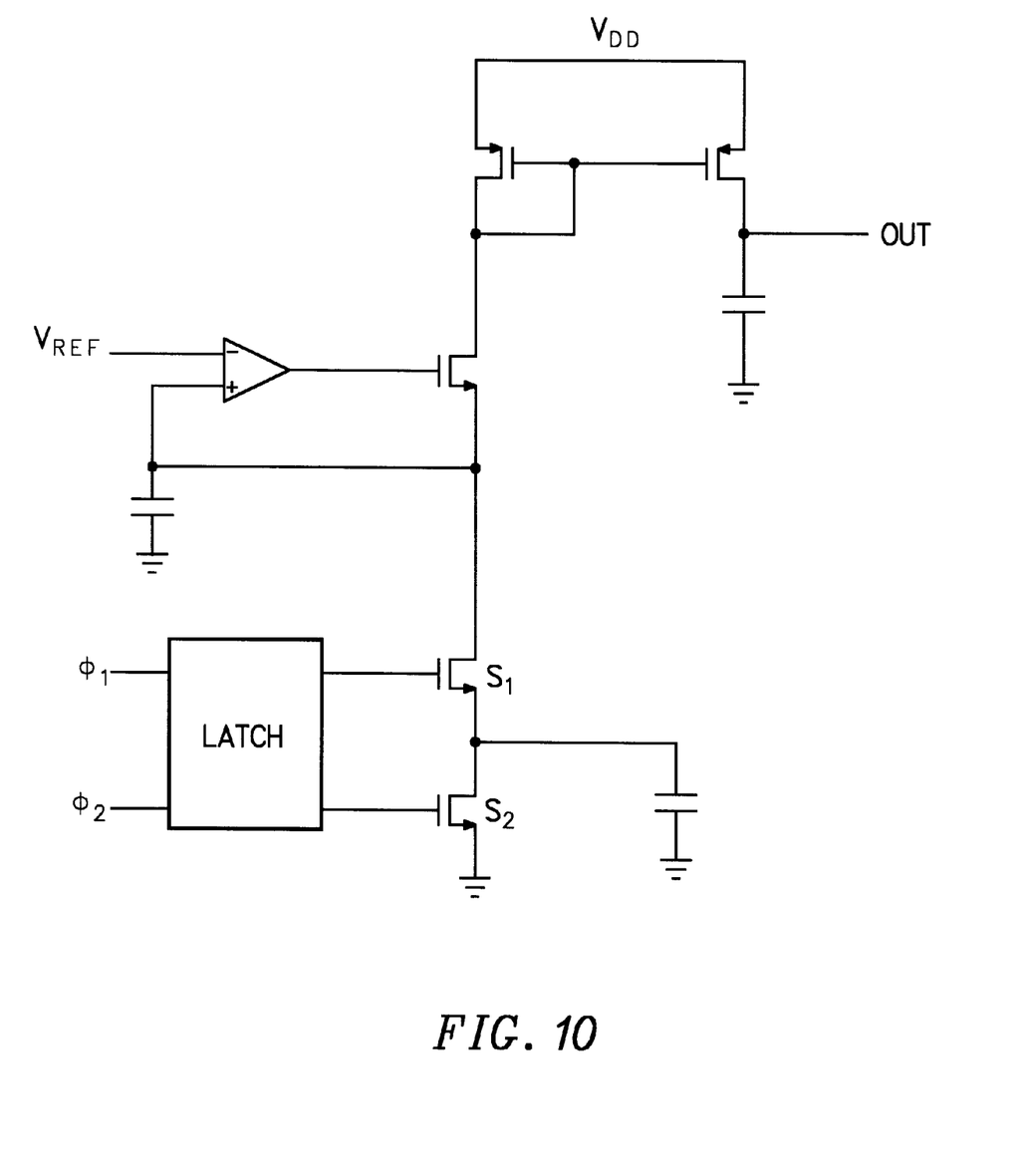
FIG. 10 is a circuit diagram of an alternative embodiment for the bias current generator of the present invention.

Thus, the present invention provides an improved phase detector circuit that utilizes switched capacitor techniques in implementing a stable bias current. The resulting phase detector operates with drastically reduced sensitivity to variations in temperature, process parameters and power supply voltage. It will be understood by those skilled in the art that various modifications and changes may be made to the specific embodiments disclosed without departing from the spirit and scope of the present invention. For example, the various circuits can be designed with the polarities of the devices reversed while maintaining the same operational advantages. That is, in the case of bias generator circuit 58 depicted in FIG. 7, for example, the bias current is referenced to the positive power supply $V_{DD}$. The bias current could be referenced to ground by reversing the polarities of the circuit elements. Such an alternative embodiment is shown in FIG. 10, wherein, NMOS instead of PMOS transistors are used as the switch elements S1 and S2 coupled to ground, while PMOS instead of NMOS transistors are used to implement the current mirror circuitry coupled to $V_{DD}$. This would also require a similar reversing of polarities of the circuitry for the quadrature phase detector shown in FIG. 5. The disclosure and the description herein are therefore intended to be illustrative and not in any sense limiting of the invention The scope of the present invention should instead be determined by the following claims.

What is claimed is:

1. A bias generator circuit comprising:
    a capacitive element having a first terminal;
    a first switch transistor having a first current-carrying terminal coupled to a first reference voltage, a second current-carrying terminal coupled to said first terminal of said capacitive element, and a control terminal;
    a second switch transistor having a first current-carrying terminal coupled to said first terminal of said capacitive element, a second current-carrying terminal coupled to a second reference voltage, and a control terminal;
    a non-overlapping clock generating circuit having an input coupled to receive a clock signal, a first output coupled to said control terminal of said first switch transistor, and a second output coupled to said control terminal of said second switch transistor; and
    a current mirror circuit having a first terminal coupled to said second current-carrying terminal of said second switch transistor, and a second terminal coupled to carry an output bias current, wherein, a magnitude of said output bias current is substantially proportional to a voltage differential between said first and second reference voltages times a frequency of said clock signal times a value of said capacitive element switch, and wherein said first reference voltage is a power supply voltage, and said second reference voltage is generated by a reference voltage generating circuit.

2. The bias current generating circuit of claim 1 wherein said reference voltage generating circuit comprises:

a reference voltage source;

an operational amplifier having a first input terminal coupled to said reference voltage source, a second input terminal coupled to said second current-carrying terminal of said second switch transistor, and an output terminal; and a buffer transistor having a first current-carrying terminal coupled to said second input terminal of said operational amplifier, a control terminal coupled to said output terminal of said operational amplifier and a second current-carrying terminal coupled to said first terminal of said current mirror circuit.

3. The bias current generator circuit of claim 2, wherein said reference voltage generating circuit further comprises a filtering capacitor coupled to said second input terminal of said operational amplifier.

4. A phase detector circuit detecting a phase relationship between a first signal and a second signal, the phase detector circuit comprising:

first and second capacitive elements coupled to first and second nodes, respectively;

a current source;

first and second switching elements coupling said current source to said first and second capacitive elements in response to said first and second signals; and a compare circuit coupled to said first and second nodes for comparing integrated values of said first and second signals at said first and second nodes, wherein, a magnitude of current for said current source is set by switching a third capacitive element between first and second reference signals, and wherein said first reference signal is a circuit power supply voltage, and said second reference signal is generated by reference voltage generating circuit.

5. The phase detector circuit of claim 4 wherein said current source comprises a first switch transistor coupling said third capacitive element to said first reference signal, and a second switch transistor coupling said third capacitive element to said second reference signal, and wherein said first and second switch transistors are controlled by non-overlapping clock signals.

6. A quadrature phase detector comprising:

a switching unit coupled to a first node and a second node, said switching unit configured to receive a first input signal and a second input signal with a quadrature phase relationship with said first input signal, said switching unit further comprising:

a first switching transistor coupled to said first node, said first switching transistor controlled by said first input signal; and a second switching transistor coupled to said second node, said second switching transistor controlled by said second input signal;

wherein for a first time period said first switching transistor is closed and said second switching transistor is open, and for a second time period said second switching transistor is closed and said first switching transistor is open; a sampler and comparator unit coupled to said first node and said second node, said sampler and comparator unit configured to sample a differential voltage between said first node and said second node and compare said sampled differential voltage to zero; and a bias generator coupled to said switching unit, said bias generator including:

a capacitive element having a first terminal and a second terminal;

a first switch transistor having a first current-carrying terminal coupled to a first reference voltage, a second current-carrying terminal coupled to said first terminal of said capacitive element, and a control terminal;

a second switch transistor having a first current-carrying terminal coupled to said first terminal of said capacitive element, a second current-carrying terminal coupled to a second reference voltage; and a control terminal;

a non-overlapping clock generating circuit having an input coupled to receive a clock signal, a first output coupled to said control terminal of said first switch transistor, and a second output coupled to said control terminal of said second switch transistor; and a current mirror circuit having a first terminal coupled to said second current-carrying terminal of said second switch transistor, and a second terminal coupled to carry an output bias current, wherein, a magnitude of said output bias current is substantially proportional to a voltage differential between said first and second reference voltages times a frequency of said clock signal times a value of said capacitive element;

wherein said first reference voltage is a power supply voltage, and said second reference voltage is generated by a reference voltage generating circuit.

7. A method of detecting a phase relationship between a first signal and a second signal, comprising the steps of:

(A) generating a bias current by switching a capacitive element between a power supply voltage and a reference signal;

(B) integrating said bias current over a first capacitor made of a structure substantially similar to that of said capacitive element, in response to said first signal, to generate a first quadrature integrated signal;

(C) integrating said bias current over a second capacitor made of a structure substantially similar to that of said capacitive element, in response to said second signal, which has a quadrature phase relationship with said first signal, to generate a second quadrature integrated signal; and (D) measuring a difference between magnitudes of said first quadrature integrated signal and said second quadrature integrated signal;

(E) generating said reference signal with a reference voltage generating circuit.

8. The method of claim 7 further comprising the step of comparing the measured difference between the magnitudes of the first and second quadrature integrated signals to zero.

* * * * *